United States Patent
Ito et al.

[11] Patent Number: 6,114,755
[45] Date of Patent: Sep. 5, 2000

[54] SEMICONDUCTOR PACKAGE INCLUDING CHIP HOUSING, ENCAPSULATION AND THE MANUFACTURING METHOD

[75] Inventors: Makoto Ito; Kenji Ohsawa, both of Kanagawa, Japan

[73] Assignee: Sony Corporation, Tokyo, Japan

[21] Appl. No.: 08/862,396

[22] Filed: May 23, 1997

[30] Foreign Application Priority Data

May 24, 1996 [JP] Japan .................................. 8-129467

[51] Int. Cl.⁷ .................................................. H01L 23/12
[52] U.S. Cl. ........................... 257/675; 257/712; 257/778
[58] Field of Search ................................. 438/123, 125, 438/126, 127, 111, 112; 257/673, 674, 738, 669, 667, 730, 675, 666, 692, 778, 779, 780, 712, 678

[56] References Cited

U.S. PATENT DOCUMENTS

| | | | |
|---|---|---|---|
| 4,209,355 | 6/1980 | Burns | 156/630 |
| 5,481,798 | 1/1996 | Ohsawa et al. | 29/827 |
| 5,583,378 | 12/1996 | Marrs et al. | 257/710 |
| 5,602,059 | 2/1997 | Horiuchi | 438/126 |
| 5,663,106 | 9/1997 | Karavakis et al. | 29/841 |
| 5,720,099 | 2/1998 | Parker et al. | 29/825 |
| 5,728,599 | 3/1998 | Rostoker | 438/123 |
| 5,756,377 | 5/1998 | Ohsawa | 438/111 |
| 5,760,465 | 2/1996 | Alcoe et al. | 257/669 |
| 5,945,741 | 8/1999 | Ohsawa et al. | 257/777 |

*Primary Examiner*—Donald L. Monin, Jr.
*Assistant Examiner*—Michael Dietrich
*Attorney, Agent, or Firm*—Hill & Simpson

[57] ABSTRACT

A semiconductor package provided with a reinforcing plate on the side of the lead joined face of which a chip housing concave portion is formed, a semiconductor chip housed and fixed in the chip housing concave portion of this reinforcing plate, a plurality of leads joined and held on the lead joined face of the reinforcing plate, the inner lead section of which is joined to the semiconductor chip via a bump and in the outer lead section of which a protruded electrode is formed, a solder resist film formed on the lead except the bump formed area and the electrode formed area of this lead and a polyimide film formed on the side of the inner lead section of the lead on the solder resist film and the manufacturing method are disclosed and hereby, the quality of the semiconductor package with ultra-multipin structure is stabilized.

3 Claims, 5 Drawing Sheets

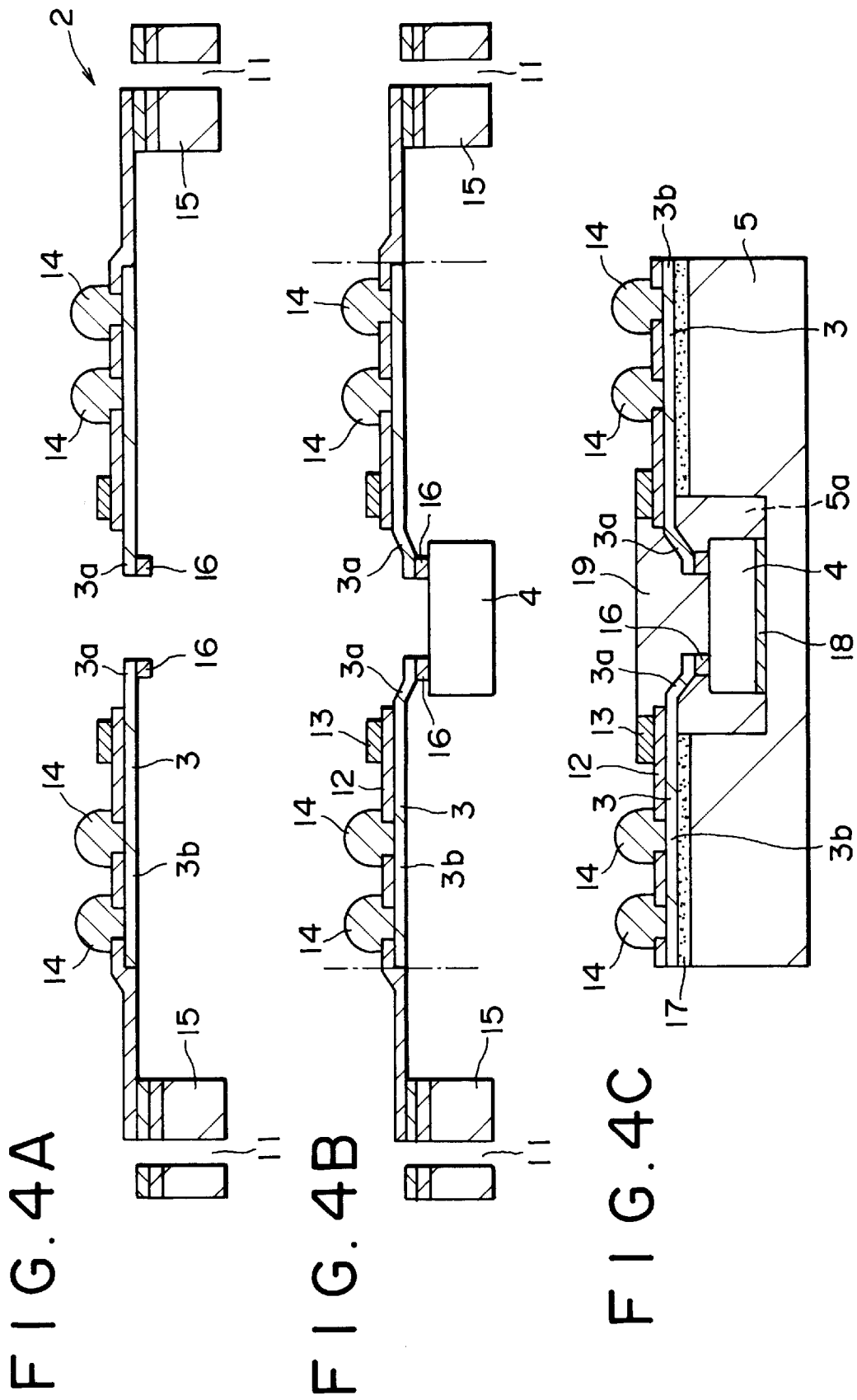

SEMICONDUCTOR PACKAGE INCLUDING CHIP HOUSING, ENCAPSULATION AND THE MANUFACTURING METHOD

BACKGROUND OF THE INVENTION

1. Field of the Invention

The present invention relates to a semiconductor package with ultra-multipin structure produced by joining a semiconductor chip to a new leadframe and the manufacturing method.

2. Description of Related Art

FIG. 5 shows a semiconductor package which can be connected to a wiring board and others via an organic substrate provided with a protruded electrode such as a solder ball.

As shown in FIG. 5, a semiconductor chip 51 is mounted on the surface of a multilayer organic wiring substrate 50 consisting of two to six layers and formed by organic material. The electrode of this semiconductor chip 51 and a wiring film 52 formed on the surface of the multilayer organic wiring substrate 50 are connected by wire bonding using a gold wire 53 and others for example.

A solder ball 55 which functions as a protruded electrode and is electrically connected to the wiring film 52 on the surface via a through hole 54 is provided on the rear of the multilayer organic wiring substrate 50 and this solder ball 55 is protruded from a solder resist film 56. The semiconductor chip 51 is sealed with sealing resin 57 together with the gold wire 53.

The solder ball 55 formed on the rear of a semiconductor package 58 constituted as described above is connected to a circuit wiring board 59. The multilayer organic wiring substrate 50 is often called a ball grid array (BGA) because multiple solder balls 55 are arranged in the shape of a grid and the semiconductor package 58 using this multilayer organic wiring substrate 50 is called BGA package.

There is a limit to reduce pitch between electrode pads on the side of the semiconductor chip 51 because the electrode of the semiconductor chip 51 and the wiring film 52 of the multilayer organic wiring substrate 50 are connected by wire bonding in this BGA package 58.

There are the following problems because a method of physically placing a so-called solder ball is adopted to form an electrode on the side of the multilayer organic wiring substrate 50:

(1) When the solder ball 55 is set in a predetermined position, misregistration often occurs.

(2) The size of the solder ball 55 is not fixed because the ball is selected using a sieve, a mesh and others.

(3) There is a limit in reducing the array pitch of the solder balls 55.

(4) The uniformity of the size of the solder ball 55 and formation by electroplating which enables the reduction of pitch are disabled because the base of the multilayer organic wiring substrate 50 is a base material.

(5) There is a limit to the composition of the solder ball 55.

Therefore, this applicant proposed a semiconductor package provided with ultra-multipin structure formed by joining a new leadframe and a semiconductor chip. FIG. 6 shows the structure of this semiconductor package and the semiconductor package is manufactured as follows:

First, to manufacture a semiconductor package 60 shown in FIG. 6, multiple leads 61 are formed on the surface of a metallic base not shown in FIG. 6 and prepared beforehand by copper electroplating, a polyimide film 62 for holding each lead 61 in a part except the inner lead section 61a is formed and further, a solder resist film 63 is formed.

Next, a protruded electrode 64 is formed in the outer lead section 61b of each lead 61 by electroplating, afterward the metallic base is selectively removed with the peripheral coupled portion left and hereby, a leadframe 65 in which each lead 61 is separated is obtained.

Next, a semiconductor chip 67 is joined to the inner lead section 61a of the lead 61 via a bump 66 and afterward, the body of a package 69 is stuck on the rear of the lead 61 except the inner lead section 61a via an adhesive layer 68. Finally, the semiconductor chip 67 housed in the body of the package 69 is sealed with resin 70 and further, an individual semiconductor package 60 is obtained by removing the coupled portion of the leadframe 65. In this case, multiple protruded electrodes 64 are formed and arranged in the shape of a grid around the semiconductor chip 67.

According to this semiconductor package 60, the lead 61 can be minutely patterned by forming the lead 61 and the protruded electrode 64 by electroplating using the metallic base. The protruded electrode 64 is formed in a right position, the size of each protruded electrode 64 is unified, pitch between protruded electrodes 64 can be reduced and the miniaturization of LSI and increasing the number of pins to ultra-multipin structure are enabled.

However, in the constitution of this semiconductor package 60, as the polyimide film 62 for reinforcing a lead and the solder resist film 63 for protecting a lead are overlapped on the lead 61 and difference in a level is made in the overlapped portion, there are the following problems:

That is, as a portion formed by the overlapped polyimide film 62 and solder resist film 63 is locally a cavity as shown in FIG. 7, the lead 61 is locally etched because of the existence of the hollow portion 71 and disconnection may be caused if the metallic base is selectively etched in the package manufacturing process.

When the solder plated ball is formed, a chemical such as a plating agent infiltrates from a location shown by a letter A in FIG. 7, is collected in the hollow portion 71, the failure of deposition occurs around it and an alloy layer may be formed. As this alloy layer produced due to the failure of deposition is formed between leads 61 and is left without being etched even when the metallic base is selectively etched, it causes a short circuit between the leads.

Further, in the final leadframe cleaning process, a chemical such as a plating agent is left and it causes stain and failure.

SUMMARY OF THE INVENTION

A semiconductor package according to the present invention is provided with the body of a package in which a chip housing concave portion is formed on the side of the lead joined face, a semiconductor chip housed and fixed in the chip housing concave portion in the body of this package, a plurality of leads joined on the lead joined face of the body of the package and held, the inner lead section of which is joined to the semiconductor chip via a bump and in the outer lead section of which a protruded electrode is formed, a lead protective coat formed on the lead except the bump formed area and the electrode formed area of this lead and a lead reinforcing film formed on the side of the inner lead section of the lead on the lead protective coat.

A method of manufacturing the semiconductor package according to the present invention is provided with a process in which a plurality of leads are formed by copper plating on the surface of a metallic base formed by laminating an etching stopping film and a plating substrate film on a substrate consisting of copper or a copper alloy in order, a process in which a lead protective coat is formed on the lead formed surface of the metallic base except the bump formed area and the electrode formed area of the lead, a process in which a lead reinforcing film is formed on the side of the inner lead section of the lead on the lead protective coat, a process in which a protruded electrode is formed in the outer lead section of the lead, a process in which each lead is separated by selectively removing the metallic base by etching and a process in which a semiconductor chip is joined to the inner lead section of the lead.

As in the present invention, a lead protective coat is formed on a plurality of leads except the respective bump formed area and the respective electrode formed area and a lead reinforcing film is formed on this lead protective coat, no difference in a level made by the overlap of films is formed on a lead differently from a case according to the prior art. Therefore, as no local cavity exists on the lead and no collection of a chemical by the infiltration of the chemical from a portion with difference in a level also exists, various problems caused due to these can be securely avoided.

BRIEF DESCRIPTION OF THE DRAWINGS

FIGS. 4A to 4C are manufacturing process drawings (3/3) showing the embodiment of the manufacturing method of the semiconductor package according to the present invention;

DESCRIPTION OF THE PREFERRED EMBODIMENT

Figure 1:
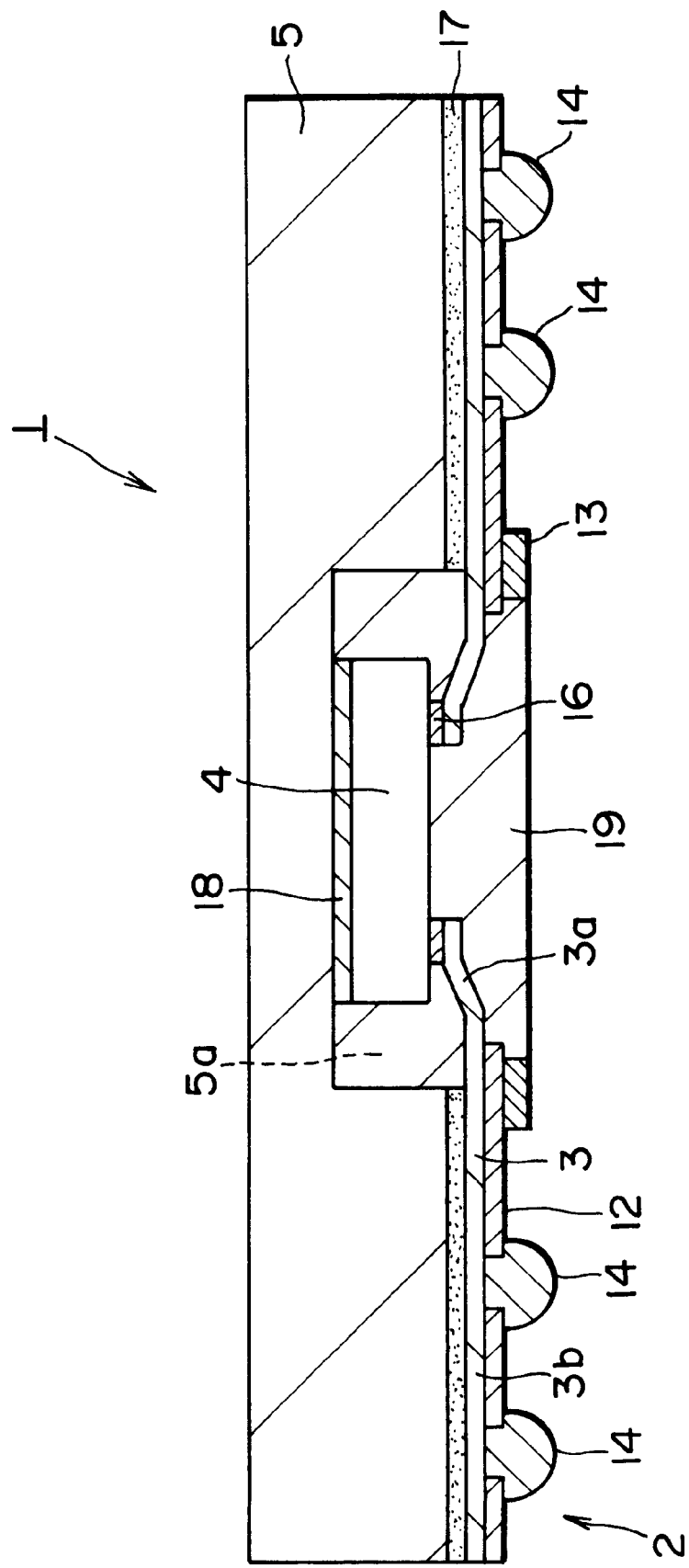
FIG. 1 is a side sectional view showing an embodiment of a semiconductor package according to the present invention.

Referring to the drawings, an embodiment of the present invention will be described in detail below.

FIG. 1 is a side sectional view showing an embodiment of a semiconductor package according to the present invention and FIGS. 2 to 4 are manufacturing process drawings of the semiconductor package in this embodiment.

Figure 2A:
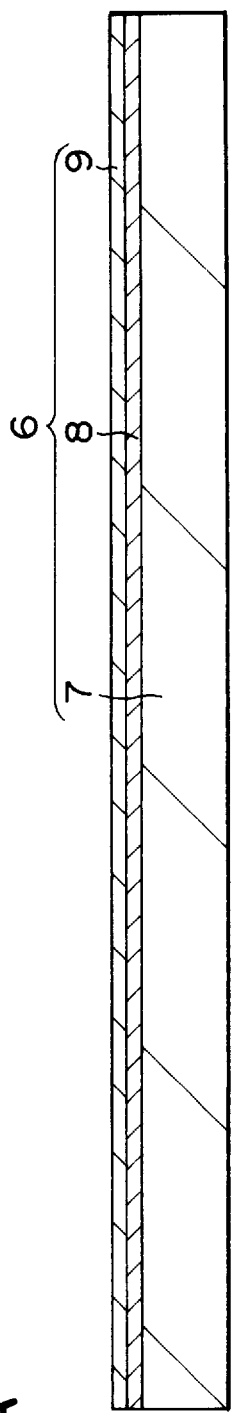
FIGS. 2A to 2C are manufacturing process drawings (⅓) showing an embodiment of the manufacturing method of the semiconductor package according to the present invention.

A semiconductor package 1 shown in FIG. 1 is mainly constituted by a leadframe 2 (strictly speaking, showing a lead body structure after the junction of the leadframe is disconnected), a semiconductor chip 4 joined to the inner lead section 3a of each lead 3 of this leadframe and a reinforcing plate 5 which is the body of the package, and manufactured by the following method:

First, as shown in FIG. 2A, a metallic base 6 is prepared. This metallic base 6 is a laminated plate consisting of three layers produced by forming an aluminum film 8 approximately 4.5 μm thick on the surface of a substrate 7 (hereinafter called a copper substrate) consisting of copper or a copper alloy approximately 150 μm thick, for example by deposition and further forming a nickelic film 9 approximately 1 to 2 μm thick. The nickelic film 9 is formed by deposition and electroplating.

The aluminum film 8 of the above films is equivalent to an etching stopping film for preventing the surface of the metallic base 6 from being etched when the copper substrate 7 is etched in the posterior process. In the meantime, the nickelic film 9 is equivalent to the substrate of copper plating for forming a lead on the surface of the metallic base 6, that is, a plated substrate film. The metallic base 6 itself does not function as a lead and finally, is removed, however, it is transitionally essential as a base substrate and as a leadframe afterward to form a very minute lead and functions as a so-called lead forming substrate.

For the metallic base 6, a chrome film approximately 0.5 μm thick for example may also be formed between the aluminum film 8 and the nickel film 9 as a contact film so as to enhance the adhesion of both films. For the plating substrate film, a copper thin film may also be formed in place of the nickelic film 9.

For the metallic base 6, a metallic base wherein a nickelic layer or a nickel alloy layer is coated as an etching stopper on either side of a copper sheet or a copper alloy sheet and a thin copper layer is formed if necessary to enhance adhesion to an inner lead formed on the metallic base may also be used.

Figure 2B:
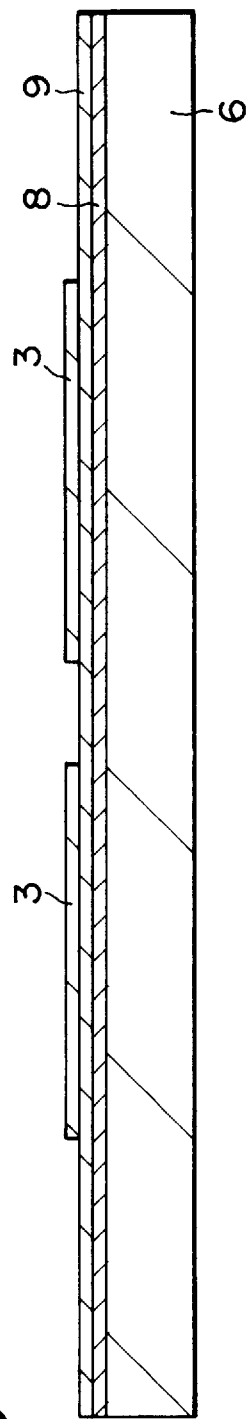

Next, as shown in FIG. 2B, multiple leads consisting of copper, that is, multiple leads 3 integrated with a pad for forming a protruded electrode such as a solder ball at the end of each lead are formed on the surface of the metallic base 6, that is, the surface of the nickelic film 9 by selective plating. These multiple leads 3 are formed so that they are extended in four directions corresponding to electrodes formed on the four sides of a semiconductor chip and the pad not shown at the end of each lead is arranged on the periphery so that the pads are latticed.

The above selective plating is executed by selectively covering the surface of the metallic base 6 with a resist pattern and others and executing electroplating using this resist pattern as a mask. As described above, the lead 3 patterned minutely, improving the quality of its film can be formed by selectively plating the metallic base 6 with copper by electroplating. In this case, the lead 3 is formed so that it is for example 25 μm thick, 35 μm wide and 70 μm in pitch.

Figure 2C:
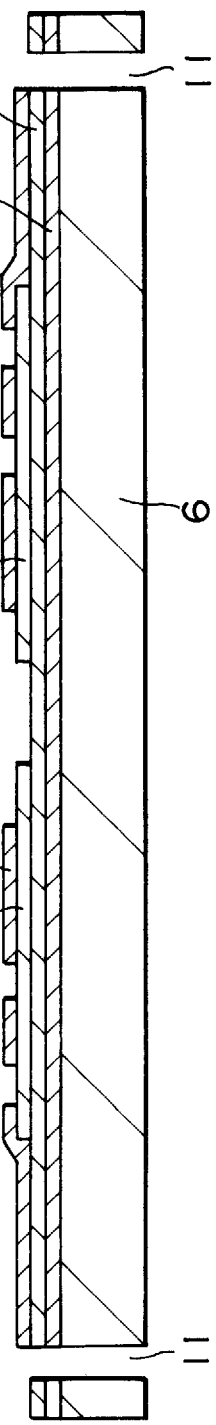

Next, as shown in FIG. 2C, a slit 11 for defining the external form every chip of a leadframe and a hole not shown in FIG. 2C and provided on the metallic base 6 for facilitating manufacture are formed. Further, a solder resist film 12 approximately 40 μm thick for example is formed on the lead formed surface of the metallic base 6 except the bump formed area E1 and the electrode formed area E2 of the lead 3. This solder resist film 12 is equivalent to a lead protective coat for protecting the lead 3 from outside and insulates the lead 3 from another lead. In the meantime, the bump formed area E1 is an area required for forming a bump on the lead 3, the electrode formed area E2 is an area required for forming a protruded electrode on the lead 3 and the solder resist film 12 is patterned so that it does not cover these areas E1 and E2.

Figure 3A:
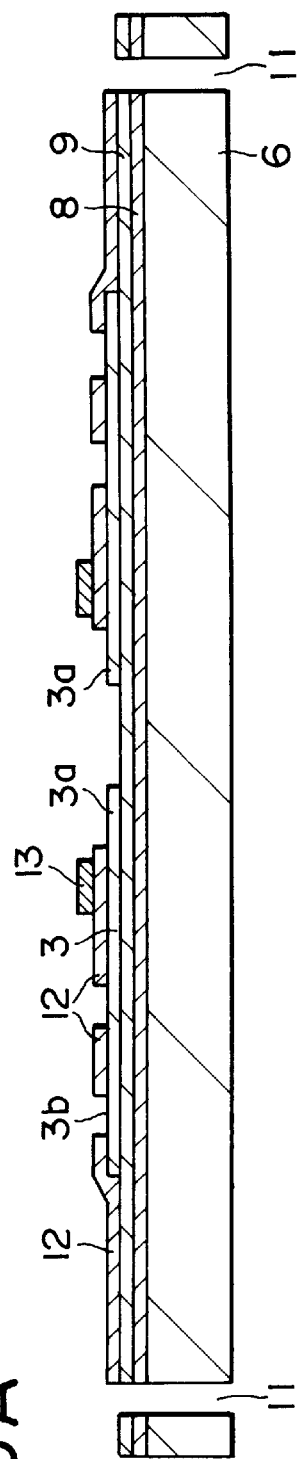
FIGS. 3A to 3C are manufacturing process drawings (⅔) showing the embodiment of the manufacturing method of the semiconductor package according to the present invention.

Next, as shown in FIG. 3A, a polyimide film 13 approximately 75 μm thick for example is formed on the side of the inner lead section 3a of the lead 3 on the solder resist film 12 which is a lead protective coat. This polyimide film 13 is equivalent to a lead reinforcing film for preventing the side of the end of the lead 3, that is, the inner lead section 3a from being warped or lifted and formed linearly over each lead 3 to connect each lead 3. The polyimide film 13 is formed in the shape of a substantially quadrangular frame when viewed from the top so that the film surrounds the above bump formed area E1.

At this time, as the solder resist film 12 is flatly formed on the lead 3 and the polyimide film 13 is laminated on the solder resist film 12, no difference in a level is made between the films on the lead 3.

The lead reinforcing film may be also formed by sticking a polyimide tape formed in the shape of a frame beforehand on the solder resist film 12.

Figure 3B:
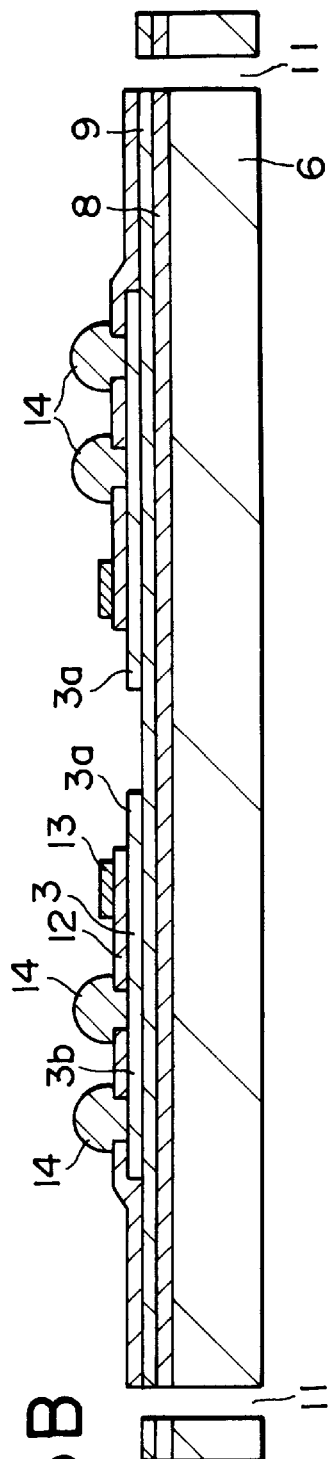

Next, as shown in FIG. 3B, a protruded electrode 14 consisting of a solder ball on the outer lead section 3B of the lead 3 by plating is formed. This protruded electrode 14 can be obtained by forming a substrate film not shown consisting of metallic material such as copper (Cu), nickel (Ni) and gold (Au) on a lead pad exposed in the above electrode formed area E2 by electroplating and forming solder material in the shape of a ball by reflowing it after the solder material consisting of the alloy of tin (Sn) and lead (Pb) is further laminated on this substrate film by electroplating.

The protruded electrode may be also formed by forming the above substrate film with the alloy of tin and lead, laminating solder material of the same composition on the substrate film and forming it in the shape of a ball, however, it is desirable that copper or nickel is used for the substrate film considering the junction of a lead pad and a protruded electrode.

Figure 3C:
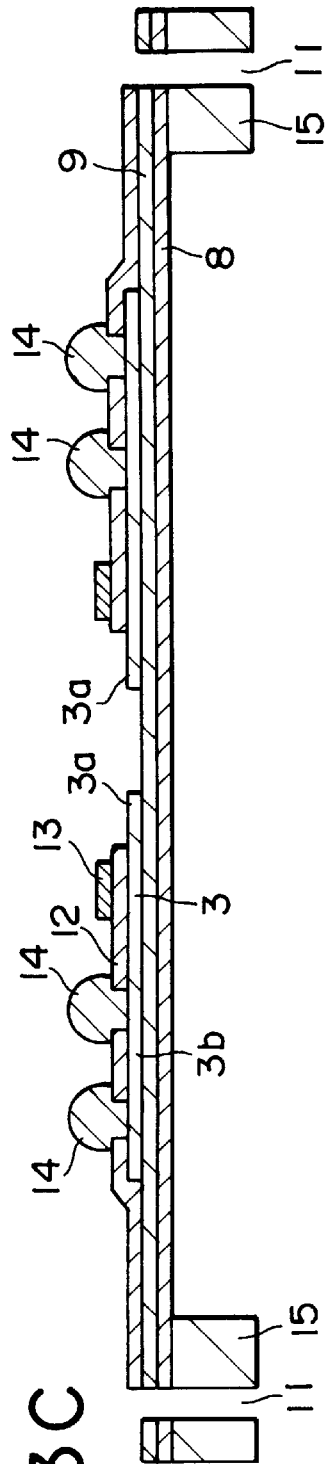
Figure 5:
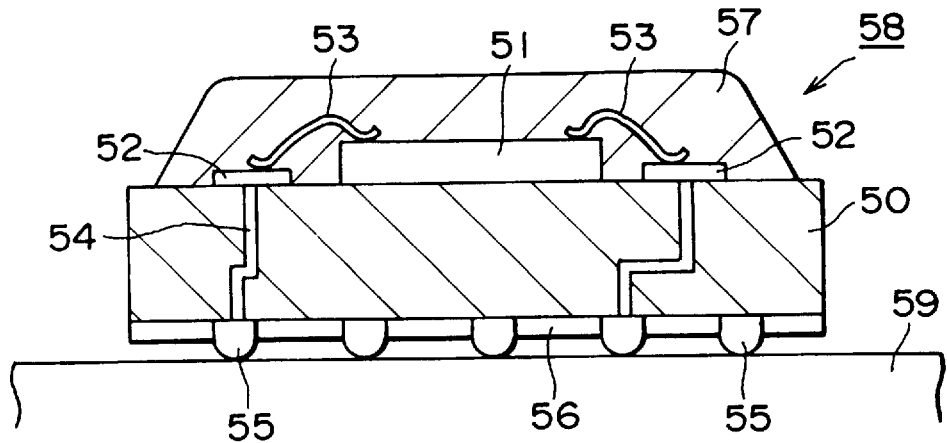
FIG. 5 is a side sectional view showing a ball grid array (BGA) package in a prior art.
Figure 6:
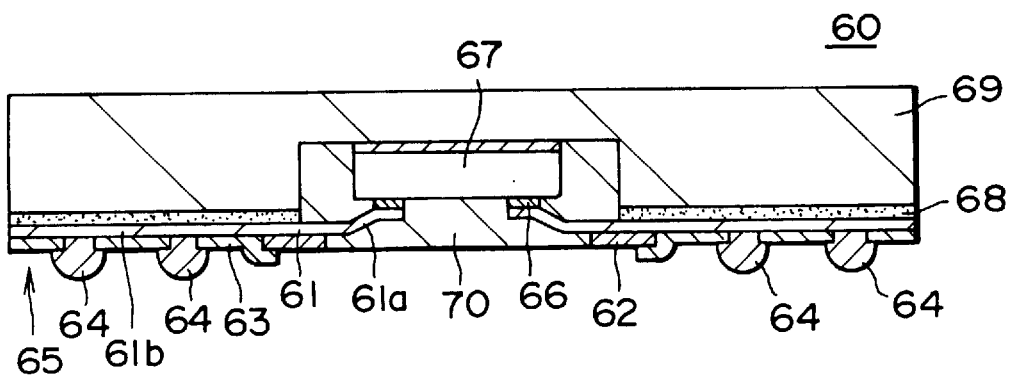
FIG. 6 is a side sectional view showing an example of a semiconductor package with ultra-multipin structure.
Figure 7:
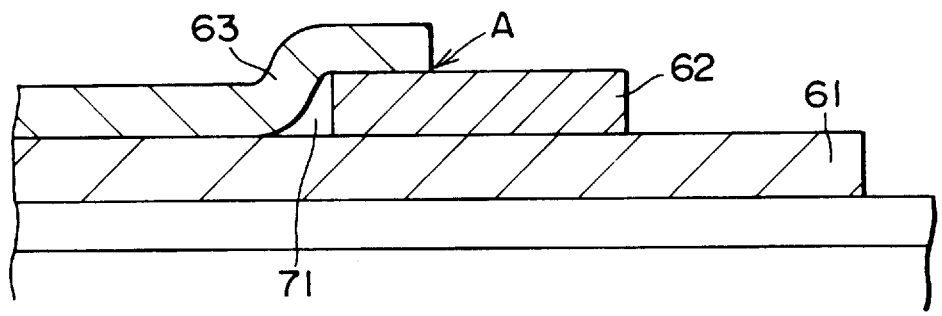
FIG. 7 explains a problem.

Next, as shown in FIG. 3C, the copper substrate 7 except the peripheral coupled portion 15 of the metallic base 6 is removed by selectively etching the copper substrate using etchant (for example, consisting of hydrogen peroxide accounting for 12%, sulfuric acid accounting for 12% and water accounting for 76%) corresponding to the copper substrate so that the peripheral coupled portion 15 is left. In the above etching, the aluminum film 8 functions as an etching stopper and only the copper substrate 7 can be removed.

Next, as shown in FIG. 4A, each lead 3 is separated by removing the aluminum film 8 of the metallic base 6 by selective etching and further removing the nickelic film 9 by selective etching. Afterward, a bump 16 consisting of aluminum is formed at the end of each inner lead 3a by sputtering or deposition.

The bump 16 can be also obtained by selectively etching the aluminum film 8 and the nickelic film 9 so that the bump 16 consisting of the aluminum film 8 is left at the end of each inner lead 3, however, it is desirable that a bump is formed separately considering that the bump is contaminated by etching.

In this case, the peripheral coupled portion 15 of the metallic base 6 is held by the solder resist film 12. As described above, the leadframe 2 provided with multiple leads 3 and protruded electrodes 14 formed in their outer lead sections 3b is formed.

Next, as shown in FIG. 4B, a semiconductor chip 4 is joined in the leadframe 2. That is, the end of each inner lead 3a is joined to the electrode such as an aluminum pad of the semiconductor chip 4 via the bump 16 formed at the end of each inner lead 3 and hereby, the leadframe 2 and the semiconductor chip 4 are electrically connected. At this time, as the movement of the inner lead section 3a in the transverse direction is prevented by the polyimide film 13, the strength of the junction of the leadframe 2 and the semiconductor chip 4 is very stable.

Next, as shown in FIG. 4C, a reinforcing plate 5 the section of which is concave so that the semiconductor chip 4 is housed is stuck on the rear of the leadframe 2 corresponding to the outer lead section 3b via an adhesive 17. It is desirable considering the heat release of the whole package that a ceramic or an aluminum rigid plate is used for the reinforcing plate 5 and a ductile elastic adhesive which is excellent in heat release, for example a polyolefine adhesive is used for the adhesive 17.

In the meantime, the rear of the semiconductor chip 4 is stuck on the bottom face of the concave portion of the reinforcing plate 5 via thermal conductive paste 18 and hereby, the semiconductor chip 4 is housed and fixed in the concave portion 5a of the reinforcing plate 5.

Finally, resin 19 is injected into the concave portion 5a of the reinforcing plate 5 and after the semiconductor chip 4 is sealed hereby, the coupled portion 15 of the leadframe 2 is removed by cutting the leadframe 2 in a position shown by a chain line shown in FIG. 4B.

Hereby, a semiconductor package 1 with ultra-multipin structure shown in FIG. 1 can be obtained.

In the constitution of the semiconductor package 1 obtained as described above, as shown in FIG. 1, the semiconductor chip 4 is housed in the concave portion of the reinforcing plate 5 which is the body of a package, that is, the chip housing concave portion 5a and fixed by the thermal conductive paste 18. A plurality of leads 3 are joined to the lead joined face 5b of the reinforcing plate 5 by the adhesive 17 and held. The inner lead section 3a of each lead 3 is joined to the semiconductor chip 4 via the bump 16 and the protruded electrode 14 consisting of a solder ball is formed in the outer lead section 3b. Further, the solder resist film 12 as a lead protective coat is formed on the lead 3 except the above bump formed area and electrode formed area and the polyimide film 13 which is a lead reinforcing film is formed on the side of the inner lead section 3a on this solder resist film 12. The semiconductor chip 4 housed and fixed in the chip housing concave portion 5a of the reinforcing plate 5 is sealed with the resin 19.

As described above, as the solder resist film 12 which functions as a lead protective coat is flatly formed on each lead 3 in this embodiment and the polyimide film 13 which functions as a lead reinforcing film is formed on the solder resist film 12, no difference in a level caused by the deposition of the films on the lead 3 is made.

Therefore, in the manufacturing process of the semiconductor package 1, as no cavity made by difference in a level is formed on the lead 3 and no chemical such as etchant and a plating agent infiltrates into an interface between the lead 3 and the solder resist film 12, various problems caused by these can be securely avoided.

As the polyimide film 13 which functions as a lead reinforcing film is formed in the shape of a substantially quadrangular frame when viewed from the top and formed on the solder resist film 12, the polyimide film 13 on the solder resist film 12 functions as an outer moat, a so-called weir when the semiconductor chip 4 is sealed with the resin 19.

Hereby, as the periphery of the resin 19 is dammed by the frame of the polyimide film 13 even if the injected quantity of resin a little fluctuates when the resin 19 is injected into the concave portion 5a (the chip housing concave portion) of the reinforcing plate 5, the semiconductor package 1 which is excellent in appearance can be readily obtained.

For a lead reinforcing film, a film consisting of another material provided with a function for reinforcing a lead may be also used in addition to the above polyimide film 3.

As described above, according to the present invention, as a lead protective coat is formed on a plurality of leads except each bump formed area and electrode formed area and a lead reinforcing film is formed on this lead protective coat, no difference in a level caused by the deposition of films is formed though difference in a level is formed heretofore. Therefore, as no local cavity exists on a lead and no pool of a chemical produced by the infiltration of the chemical from a portion with the above difference in a level exists, various problems such as the failure of the disconnection of a lead in the selective etching of a metallic base, a short circuit between leads caused by abnormal deposition and infiltration by the remainder of a chemical can be securely avoided. As a result, the quality of a semiconductor package with ultra-multipin structure can be enhanced and can be stabilized.

What is claimed is:

1. A semiconductor device, comprising:

a semiconductor chip in a concave area of a chip housing;

a plurality of leads each having an inner lead section which is joined to said semiconductor chip and an outer lead section having a protruded electrode area at which a protruded electrode is formed, the inner lead section being a portion of said lead extending at least from a wall of said concave area and is joined to said semiconductor chip;

a lead protective coat formed on said plurality of leads except a bump forming area and the protruded electrode area of said lead, and extending into said concave area; and a lead reinforcing film formed on said lead protective coat and extending into said concave area, the reinforcing film being made of a dielectric material which is different from a material of the lead protective coat, and wherein the lead protective coat completely covers any portion of said leads located beneath the lead reinforcing film.

2. A semiconductor device according to claim 1, wherein:

said lead reinforcing film is formed in the shape of a frame surrounding said chip; and said semiconductor chip is sealed with resin and further wherein the lead reinforcing film forms a dam for the resin material.

3. The semiconductor device of claim 1, wherein the plurality of leads are defined by an electrically conductive leadframe.

* * * * *